United States Patent
Autry et al.

(10) Patent No.: US 12,160,242 B1
(45) Date of Patent: Dec. 3, 2024

(54) HIGHLY STABLE CHIP-SCALE ATOMIC BEAM CLOCKS USING MINIATURIZED ATOMIC BEAMS AND MONOLITHIC CLOCK CHIPS

(71) Applicant: HRL Laboratories, LLC, Malibu, CA (US)

(72) Inventors: Travis Autry, Calabasas, CA (US); Raviv Perahia, Agoura Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 26 days.

(21) Appl. No.: 18/197,041

(22) Filed: May 13, 2023

(51) Int. Cl.
| | |
|---|---|
| H03L 7/26 | (2006.01) |
| G04F 5/14 | (2006.01) |
| H01S 5/00 | (2006.01) |
| H01S 5/02325 | (2021.01) |
| H01S 5/02375 | (2021.01) |
| H01S 5/183 | (2006.01) |

(52) U.S. Cl.
CPC .................. *H03L 7/26* (2013.01); *G04F 5/14* (2013.01); *H01S 5/0071* (2013.01); *H01S 5/02325* (2021.01); *H01S 5/02375* (2021.01); *H01S 5/183* (2013.01)

(58) Field of Classification Search
CPC . H03L 7/26; G04F 5/14; H01S 5/0071; H01S 5/02325; H01S 5/02375
USPC .......... 331/3, 94.1; 324/96, 244.1; 250/215, 250/216
See application file for complete search history.

(56) References Cited

U.S. PATENT DOCUMENTS

2009/0059980 A1* 3/2009 Braun ................... H01S 5/141
372/38.01

* cited by examiner

*Primary Examiner* — Arnold M Kinkead
(74) *Attorney, Agent, or Firm* — O' Connor & Company; Ryan P. O' Connor

(57) ABSTRACT

A low-power, chip-scale atomic beam clock is provided that maintains high precision for at least one week at any practical temperature. In some variations, the invention provides a chip-scale atomic beam clock comprising: a micro-optical bench; an atom collimator configured to generate a collimated atomic beam via differential pumping through microchannels; a VCSEL configured to emit laser photons horizontally in the plane of the micro-optical bench; an in-plane lithographically defined diffraction grating configured to split the laser photons into a first photon beam and a second photon beam; in-plane lithographically defined mirrors configured to retroflect the photon beams; in-plane photodetectors configured to detect the photon beams after being retroflected, wherein the first photon beam and the second photon beam interrogate the collimated atomic beam in-plane with the micro-optical bench. The chip-scale atomic beam clocks is capable of maintaining precise positioning, navigation, and timing in case of GPS denial or failure.

28 Claims, 13 Drawing Sheets

HIGHLY STABLE CHIP-SCALE ATOMIC BEAM CLOCKS USING MINIATURIZED ATOMIC BEAMS AND MONOLITHIC CLOCK CHIPS

FIELD OF THE INVENTION

The present invention generally relates to chip-scale atomic beam clocks, and methods of making and using chip-scale atomic beam clocks.

BACKGROUND OF THE INVENTION

Frequency stability is required for modern, high-speed communications, navigation, electronic instrumentation, and many other applications. Atomic frequency references are devices for producing or probing frequencies and are based on the energy difference between two or more energy levels of a quantum system. In an atom, quantum mechanics requires that the electrons exist only in certain states with specific, discrete energies. Differences between the energies of these states define correspondingly specific frequencies. Therefore, atoms can be excellent frequency references.

A dipole moment, oscillating at one of these frequencies, can be excited by an electromagnetic wave propagating in the same space as the atom. Frequency references are widely available that employ an excitation scheme in which microwave fields excite the atoms of a sample. When the microwave frequency is near the atomic oscillation frequency, a change in the atomic state can be detected by measuring the absorption or phase shift of the atomic sample. The microwave excitation technique works well but poses significant problems for miniaturization, since the microwaves are usually confined in a cavity with size scale constrained by the microwave wavelength. Such devices are rather large.

The use of microwave modulation of an optical field allows for the optical interrogation of hyperfine transitions in atoms through the use of an intermediary optical state. The optical field is tuned to be resonant with this intermediary optical state. When the microwaves modulating the optical field are tuned to be resonant with the hyperfine transition, coherent population trapping (CPT) can be observed. Coherent population trapping creates a "dark" state consisting of a superposition of the hyperfine transitions in the atoms. This dark state exhibits a long lifetime and serves as the basis for a microwave atomic clock. The use of a small laser enables the miniaturization of these clocks into chip-scale atomic clocks.

Papers describing microwave frequency references and methods to fabricate them include Knappe et al., "Atomic Vapor Cells for Chip-Scale Atomic Clocks with Improved Long-Term Frequency Stability", *Optics Letters* Vol. 30, Issue 18, pp. 2351-2353 (2005); Kitching, "Chip-Scale Atomic Devices", *Applied Physics Reviews* Vol. 5, No. 3, 031302 (2018); Dellis et al., "Low Helium Permeation Cells for Atomic Microsystems Technology", *Optics Letters* Vol. 41, Issue 12, pp. 2775-2778 (2016); Guo et al., "Low Power Consumption Physics Package for Chip-Scale Atomic Clock through Gold-Tin Eutectic Bonding", *Microsystem Technologies* 28 (7): 1601-1606 (2022); Karlen et al., "Sealing of MEMS Atomic Vapor Cells Using Cu—Cu Thermocompression Bonding", *Journal of Microelectromechanical Systems* 29 (1): 95-99 (2019); Li et al., "Cascaded Collimator for Atomic Beams Traveling in Planar Silicon Devices." *Nature Communications* 10 (1): 1831 (2019); Lucivero et al., "Laser-Written Vapor Cells for Chip-Scale Atomic Sensing and Spectroscopy", *Optics Express* 30 (15): 27149 (2022); Mescher et al., "An Ultra-Low-Power Physics Package for a Chip-Scale Atomic Clock", *TRANSDUCERS* '05, 1:311-316 Vol. 1 (2005); Pétremand et al., "Low Temperature Indium-Based Sealing of Microfabricated Alkali Cells for Chip Scale Atomic Clocks", *EFTF-2010 24th European Frequency and Time Forum*, 1-3 (2010); Serkland et al., "VCSELs for Atomic Clocks", Proceedings Volume 6132, *Vertical-Cavity Surface-Emitting Lasers X*, 613208 (2006); Straessle et al., "Low-Temperature Indium Hermetic Sealing of Alkali Vapor-Cells for Chip-Scale Atomic Clocks", 2012 *IEEE 25th International Conference on Micro Electro Mechanical Systems (MEMS)*, 361-364 (2012); and Wang et al., "Micro-Fabricated Alkali Vapor Cells Sealed at Low Temperature Using Asymmetric Au—In Transient Liquid Phase (TLP) Bonding", *Japanese Journal of Applied Physics* 58 SDDL03 (2019), each of which is incorporated by reference herein.

Frequency standards are useful in optical fiber communications, timing, radio frequency (RF) photonics, and inertial sensing, as well as in other technologies. Application areas of ultraprecise optical frequency standards include high-precision laser spectroscopy, miniature atomic instruments (e.g. atomic clocks and gyroscopes), global positioning systems, precision laser sensing (e.g., remote nuclear blast detection), and ultra-stable oscillators for high-speed analog-digital converters and radar systems.

Highly accurate optical frequency references are desired for many applications. Optical frequency references with better performance than commercially available standards are sought, to enable high-precision spectroscopy at multiple locations, for example. In general, known frequency references are either extremely precise at the cost of massive size, weight, and power, or they sacrifice performance for reduced size, weight, and power. Large optical cavity-based frequency references are currently the standard for generating an optical frequency reference at short averaging times. A fully functioning chip-scale atomic beam clock is desired, for use in secure communications and secure navigation, for example.

Conventional microwave atomic beam clocks based on cesium (Cs) have been timing workhorses since the 1960s, serving as national standards and widely used in commercial products. The stability and accuracy of conventional microwave atomic beam clocks arises from the fractionally small time the atoms interact with the control fields, enabling suppression and compensation of environmental and systematic frequency shifts. However, the bulky microwave cavities used in conventional beam clocks create a bottleneck for miniaturization.

In an attempt to address this shortcoming, chip-scale atomic clocks have been developed using optical coherent population trapping in buffer-gas cells. These chip-scale atomic clocks have been sold commercially and can offer good performance and low power consumption. However, aging and buffer gas shifts limit the clock stability of conventional chip-scale atomic clocks beyond a few thousand seconds. In particular, low size, weight, and power (SWaP) atomic clocks including chip-scale atomic clocks demonstrate poor stability beyond 1000 seconds due to thermal and buffer gas shifts. Innovative solutions are required in the design of the atomic-physics package and its supporting elements to realize a clock enabling strong day-long and week-long holdover.

In view of the aforementioned prior art, there is a need for low-power, chip-scale atomic beam clocks that can maintain microsecond precision for at least one week at any practical temperature. The chip-scale atomic beam clocks should be capable of maintaining precise positioning, navigation, and timing in case of Global Positioning System (GPS) denial or failure due to satellites being damaged, destroyed, or jammed, or for other reasons that prevent communication with GPS signals.

SUMMARY OF THE INVENTION

The present invention addresses the aforementioned needs in the art, as will now be summarized and then further described in detail below.

In some variations, the invention provides a chip-scale atomic beam clock comprising:
(a) a micro-optical bench that is fabricated from a silicon-containing material;
(b) an atom collimator configured to generate a collimated atomic beam via differential pumping through micro-channels within the micro-optical bench;
(c) a vertical-cavity surface-emitting laser configured to emit laser photons horizontally in the plane of the micro-optical bench;
(d) an in-plane diffraction grating configured to split the laser photons into a first photon beam and a second photon beam;
(e) a first in-plane mirror configured to retroflect the first photon beam, and a second in-plane mirror configured to retroflect the second photon beam, wherein the first and second in-plane mirrors are lithographically defined within the micro-optical bench; and
(f) optionally, a first in-plane photodetector configured to detect the first photon beam after being retroflected by the first in-plane mirror, and a second in-plane photodetector configured to detect the second photon beam after being retroflected by the second in-plane mirror,
wherein the first photon beam and the second photon beam interrogate the collimated atomic beam in-plane with the micro-optical bench.

In some embodiments of the chip-scale atomic beam clock, the silicon-containing material is silicon, silica, fused silica, silicates, aluminosilicates, borosilicates, silicon nitrides, silicon oxynitrides, silicon carbides, silicon oxycarbides, or combinations thereof.

In some embodiments of the chip-scale atomic beam clock, the collimated atomic beam contains Rb atoms, Cs atoms, Yb atoms, Hg atoms, Sr atoms, Al atoms, Ca atoms, H atoms, or a combination thereof.

In some embodiments of the chip-scale atomic beam clock, the in-plane diffraction grating is lithographically defined within the micro-optical bench.

In some embodiments of the chip-scale atomic beam clock, the first in-plane photodetector and/or the second in-plane photodetector are present. In other embodiments, the first and second in-plane photodetectors are not present.

In some embodiments of the chip-scale atomic beam clock, the microchannels are bonded to a contiguous top layer to form a closed environment under vacuum. The microchannels may be bonded to the contiguous top layer via direct wafer bonding, anodic bonding, metal-metal bonding, or a combination thereof, for example. The contiguous top layer may be a different composition than the silicon-containing material. The contiguous top layer may be fabricated from a material that has a coefficient of thermal expansion less than 0.05 ppm/° C. between 25° C. and 300° C. In certain embodiments, the contiguous top layer is fabricated from alkali-free glass. In certain embodiments, the contiguous top layer is fabricated from borosilicate glass. A photodetector may be mounted on the contiguous top layer to collect photoluminescence from an atom-photon interaction region.

In some embodiments of the chip-scale atomic beam clock, the vertical-cavity surface-emitting laser is configured to emit circularly polarized light. In certain embodiments, the first and second in-plane mirrors are configured to flip the polarization of the first and second photon beam, respectively, between left and right.

In some embodiments of the chip-scale atomic beam clock, the vertical-cavity surface-emitting laser is configured to emit photons with one or more wavelengths selected from about 500 nm to about 2000 nm.

In some embodiments of the chip-scale atomic beam clock, the chip-scale atomic beam clock comprises an atom-beam tube configured to contain the collimated atomic beam generated by the atom collimator. In certain embodiments, the atom-beam tube is configured to be perpendicular to the first photon beam at a first atom-photon interaction region, and the atom-beam tube is configured to be perpendicular to the second photon beam at a second atom-photon interaction region.

In some embodiments of the chip-scale atomic beam clock, the atom collimator and the vertical-cavity surface-emitting laser are configured so that the collimated atomic beam height and the laser photon beam height are the same or about the same.

The chip-scale atomic beam clock may further comprise an actuator configured to mitigate mis-alignment between the vertical-cavity surface-emitting laser and the micro-optical bench.

An outer surface of the chip-scale atomic beam clock may be coated with a low-emissivity coating to suppress radiative heat loss. The low-emissivity coating may contain gold, silver, copper, aluminum, or a combination thereof.

In some embodiments of the chip-scale atomic beam clock, a Helmholtz coil is wrapped around both sides of the micro-optical bench.

In some embodiments, the chip-scale atomic beam clock is characterized by a long-term ADEV drift less than $6 \times 10^{-13}$ after one week of operation.

In some embodiments, the chip-scale atomic beam clock has a volume of about 10 cm$^3$ or less. In some embodiments, the chip-scale atomic beam clock has a weight of about 25 grams or less. In some embodiments, the chip-scale atomic beam clock has a power requirement of about 200 mW or less.

In various embodiments, the chip-scale atomic beam clock is operable over a temperature range from −40° C. to 85° C.

In some embodiments, the chip-scale atomic beam clock is operable without Global Positioning System calibration.

DETAILED DESCRIPTION OF EMBODIMENTS OF THE INVENTION

Figure 1A:
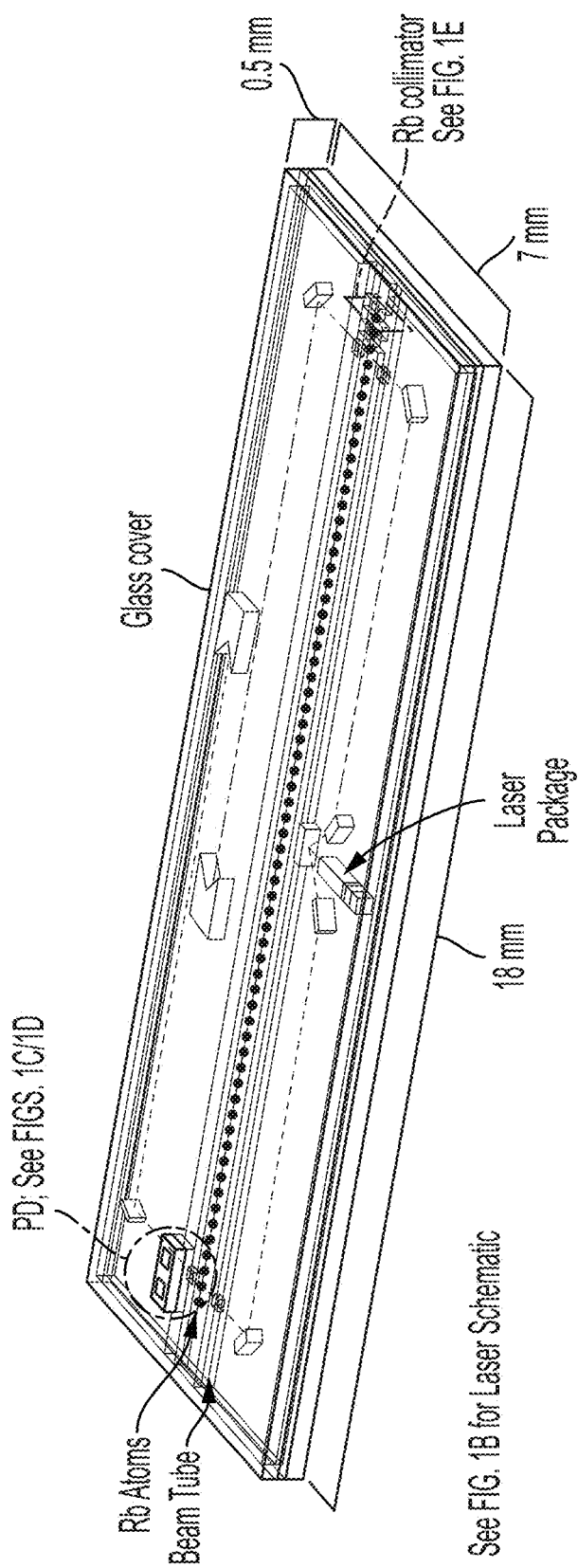
FIG. 1A shows a chip-scale glass-on-silicon atomic beam clock based on Rb atoms, including a laser package, a beam tube, a photodetector, and a Rb collimator.

The apparatus, systems, and methods of the present invention will be described in detail by reference to various non-limiting embodiments.

This description will enable one skilled in the art to make and use the invention, and it describes several embodiments, adaptations, variations, alternatives, and uses of the invention. These and other embodiments, features, and advantages of the present invention will become more apparent to those skilled in the art when taken with reference to the following detailed description of the invention in conjunction with the accompanying drawings.

As used in this specification and the appended claims, the singular forms "a," "an," and "the" include plural referents unless the context clearly indicates otherwise. Unless defined otherwise, all technical and scientific terms used herein have the same meaning as is commonly understood by one of ordinary skill in the art to which this invention belongs.

Unless otherwise indicated, all numbers expressing conditions, concentrations, dimensions, and so forth used in the specification and claims are to be understood as being modified in all instances by the term "about." Accordingly, unless indicated to the contrary, the numerical parameters set forth in the following specification and attached claims are approximations that may vary depending at least upon a specific analytical technique.

In this specification, hypotheses and theories are disclosed, it being understood that the present invention is not limited to the proposed hypotheses and theories.

The term "comprising," which is synonymous with "including," "containing," or "characterized by" is inclusive or open-ended and does not exclude additional, unrecited elements or method steps. "Comprising" is a term of art used in claim language which means that the named claim elements are essential, but other claim elements may be added and still form a construct within the scope of the claim.

As used herein, the phrase "consisting of" excludes any element, step, or ingredient not specified in the claim. When the phrase "consists of" (or variations thereof) appears in a clause of the body of a claim, rather than immediately following the preamble, it limits only the element set forth in that clause; other elements are not excluded from the claim as a whole. As used herein, the phrase "consisting essentially of" limits the scope of a claim to the specified elements or method steps, plus those that do not materially affect the basis and novel characteristic(s) of the claimed subject matter.

With respect to the terms "comprising," "consisting of," and "consisting essentially of," where one of these three terms is used herein, the presently disclosed and claimed subject matter may include the use of either of the other two terms. Thus in some embodiments not otherwise explicitly recited, any instance of "comprising" may be replaced by "consisting of" or, alternatively, by "consisting essentially of."

The presently disclosed technology enables the design and fabrication of a chip-scale atomic beam clock. In some variations, the disclosed technology realizes a chip-scale atomic beam clock in which a beam of atoms traverses from one end of the chip to the other. The chip-scale atomic beam clock may be based on rubidium (Rb), cesium (Cs), or another relevant atom. The disclosed technology is applicable to neutral atomic vapors, Rydberg atoms (excited atoms), and trapped atomic ions.

Some embodiments utilize machining of glass to create differential pumping of an atomic vapor (e.g., Cs vapor). Some embodiments utilize a silicon-containing micro-optical bench for chip-scale performance, avoiding the need for bulky optics. The micro-optical bench may include defined monolithic silicon (e.g., in-plane gratings and/or in-plane mirrors). Alternatively, or additionally, the micro-optical bench may utilize microelectromechanical mirrors and/or microelectromechanical gratings on actuators. Some embodiments incorporate novel packaging of a vertically emitting diode laser. In various embodiments, the invention utilizes a combination of optical integration, in-plane silicon mirrors, and microelectromechanical actuators.

Differential pumping of atoms may be realized through machining or physically cut microchannels in materials such as silicon or glass. In some embodiments, differential pumping in these microchannels creates a collimated atomic beam. In some embodiments, bonding of a glass microchannel to silicon forms a closed vacuum environment. This bonding may be direct wafer bonding, anodic bonding, metal-metal bonding, or other technique for combining wafers. Some embodiments utilize a thermal interposer and/or thermal coatings to reduce radiated power in an ovenized package. Some embodiments use a Helmholtz coil wrapped around glass for active stabilization of the magnetic field perturbing the atoms in the collimated beam. Magnetic-field stabilization may utilize infrequent but regular interruption of the clock readout to record the magnetic field.

Some variations employ in-plane silicon mirrors and in-plane diffraction gratings defined through deep silicon etching and chemical polishing or wet polishing of silicon. Some variations deposit metal to fabricate in-plane mirrors. Some variations utilize actuators configured for mitigating alignment issues of the laser package to the silicon-containing micro-optical bench. Some variations incorporate a vertically emitting diode laser packaged and arranged to emit horizontally in the plane of a silicon micro-optical bench. These variations may include creating a cavity in a three-dimensional piece of ceramic or other material, and then bonding, through metal-metal bonding or wafer-bonding, optical elements such as polarizers, waveplates, and collimation lenses. Some variations realize heretofore undisclosed control electronics and thermalization enabling long-term stability metrics. In preferred embodiments, this technology reduces longer-term timing errors typically associated with small-scale atomic clocks.

This specification describes novel architectures for highly stable chip-scale microwave atomic clocks using miniaturized atomic beams. Some variations are predicated on the combination of atom beams in pristine vacuum environments, on the one hand, and optical interrogation using coherent population trapping, on the other hand. This innovative combination, as disclosed herein, provides an optimized design for chip-scale atomic beam clocks.

The atomic beam clock relies on readout of atoms or ions via Ramsey spectroscopy. Ramsey spectroscopy provides an interferometric laser interrogation of an atomic resonance. Traditionally, Ramsey spectroscopy is done in the time domain, but may also be done in the spatial domain with two spatially separated electromagnetic sources and an atomic beam.

The present invention may utilize neutral atoms (e.g., $Cs^0$), excited atoms (e.g., $Cs^*$), atomic ions (e.g., $Cs^+$), or a combination thereof. For convenience, the specification will reference "atoms", "atom beams", "atomic beams", and the like, it being understood that the atoms may be neutral or ionic.

In variations of the present invention, a high-Q atomic dark state transition is realized through optical coherent population trapping (CPT) in an atom beam to realize a stable 10 MHz (for example) timing solution at week-long holdovers. The fractional frequency stability of a clock (ADEV), $\sigma_y(r)$, typically averages downward in the short term according to $$\sigma_y(\tau) = \frac{\zeta}{Q \cdot SNR\sqrt{\tau}}$$

over time scales $\tau$, where Q is the resonance quality factor, $\zeta$ is a parameter of order unity, and SNR is the signal-to-noise ratio. Environmental and systematic drifts ultimately limit the achievable long-term stability.

Various embodiments of the invention employ one or more of the following principles:

(1) Reduced systematic and long-term drifts (compared to a conventional chip-scale atomic clock) may be realized through use of an on-chip atomic beam clock (e.g., 15 mm, $Q \approx 10^6$) relying on Ramsey spectroscopy, with separated oscillatory fields, of an atomic dark state through coherent population trapping.

(2) Long-term drift and alignment errors of optical and atomic components may be reduced using a monolithic, lithographically defined in-plane optics bench fabricated from materials with low coefficient of thermal expansion (CTE), and matched CTE wafer-bonded materials (e.g., silicon and borosilicate).

(3) Known parts from chip-scale atomic clocks may be leveraged for highly reliable operation.

(4) The physics package may be thermally stabilized using low-emissivity coatings and low-power application-specific integrated circuits (ASICs) and/or monolithic microwave integrated circuits (MMICs) to reduce power budget.

The optimized design of the disclosed atom beam clocks allows for suppression of environmental and systematic drifts, with $1/\sqrt{\tau}$ averaging of the fractional frequency noise commonly demonstrated over periods of weeks. In certain embodiments, the disclosed chip-scale atomic beam clock is characterized by a short-term fractional frequency stability (ADEV) of $1.8 \times 10^{-10}/\sqrt{\tau}$ (i is the integration time in seconds) and/or a long-term drift below $6 \times 10^{-13}$/week.

To the knowledge of the present inventors, an accurate chip-scale atomic beam clock has never heretofore been demonstrated. Some prior demonstrations have demonstrated laboratory-scale atomic beam clocks. Some prior demonstrations have shown differential pumping in a small device—but never clock operation. The disclosed technology therefore satisfies a long-felt need for secure communications and secure navigation in the event of GPS denial or spoofing. The disclosed chip-scale atomic beam clock may replace master clocks in telecommunication networks. The disclosed chip-scale atomic beam clock may act as a holdover clock, such as to back up a reference clock.

Applications include, but are by no means limited to, radio detection and ranging (radar), such as to detect and track aircraft, spacecraft, guided missiles, ships, and motor vehicles, or to map weather formations and terrain; communications and autonomous navigation in various GPS-denied environments; financial transactions, such as to provide accurate time synchronization for financial trading.

In some variations, the invention provides a chip-scale atomic beam clock comprising:
  (a) a micro-optical bench that is fabricated from a silicon-containing material;
  (b) an atom collimator configured to generate a collimated atomic beam via differential pumping through microchannels within the micro-optical bench;
  (c) a vertical-cavity surface-emitting laser configured to emit laser photons horizontally in the plane of the micro-optical bench;
  (d) an in-plane diffraction grating configured to split the laser photons into a first photon beam and a second photon beam, wherein the in-plane diffraction grating is lithographically defined within the micro-optical bench; and
  (e) a first in-plane mirror configured to retroflect the first photon beam, and a second in-plane mirror configured to retroflect the second photon beam, wherein the first and second in-plane mirrors are lithographically defined within the micro-optical bench,
  wherein the first photon beam and the second photon beam interrogate the collimated atomic beam in-plane with the micro-optical bench.

In some embodiments of the chip-scale atomic beam clock, the silicon-containing material is silicon, silica, fused silica, silicates, aluminosilicates, borosilicates, silicon nitrides, silicon oxynitrides, silicon carbides, silicon oxycarbides, or combinations thereof.

In some embodiments of the chip-scale atomic beam clock, the collimated atomic beam contains Rb (rubidium) atoms, Cs (cesium) atoms, Yb (ytterbium) atoms, Hg (mercury) atoms, Sr (strontium) atoms, Al (aluminum) atoms, Ca (calcium) atoms, H (hydrogen) atoms, or a combination thereof.

In certain embodiments, the collimated atomic beam contains Rb and/or Cs. The fundamental properties of Rb and Cs make then desirable for atomic clocks. However, the present invention is by no means limited to Rb and Cs. In certain embodiments, the collimated atomic beam contains atoms such as Ce, Ca, and/or Sr.

The atomic species may be isotopically enriched relative to its natural isotopic abundance. For example, in the case of strontium (naturally occurring primarily as $^{88}$Sr), stable isotopes include $^{88}$Sr, $^{87}$Sr, $^{86}$Sr, and $^{84}$Sr. The strontium atoms may be enriched in one or more of these isotopes, compared to the natural abundance. The natural abundance of $^{88}$Sr is about 82.6% of naturally occurring Sr. An isotopically enriched source of Sr will therefore have greater than 82.6% or less than 82.6% of $^{88}$Sr, relative to all Sr atoms present. The Sr source may be enriched or depleted in $^{87}$Sr, $^{86}$Sr, and/or $^{84}$Sr.

In the case of rubidium, there are only two stable isotopes, $^{85}$Rb and $^{87}$Rb, which occur at an abundance ratio of about 2.6 ($^{85}$Rb/$^{87}$Rb). When an isotopically enriched rubidium source is utilized, the abundance ratio $^{85}$Rb/$^{87}$Rb may be greater than 2.6, which means the source is enriched with the primary isotope $^{85}$Rb, or may be less than 2.6, which means the source is enriched with the secondary isotope $^{87}$Rb.

Figure 2A:
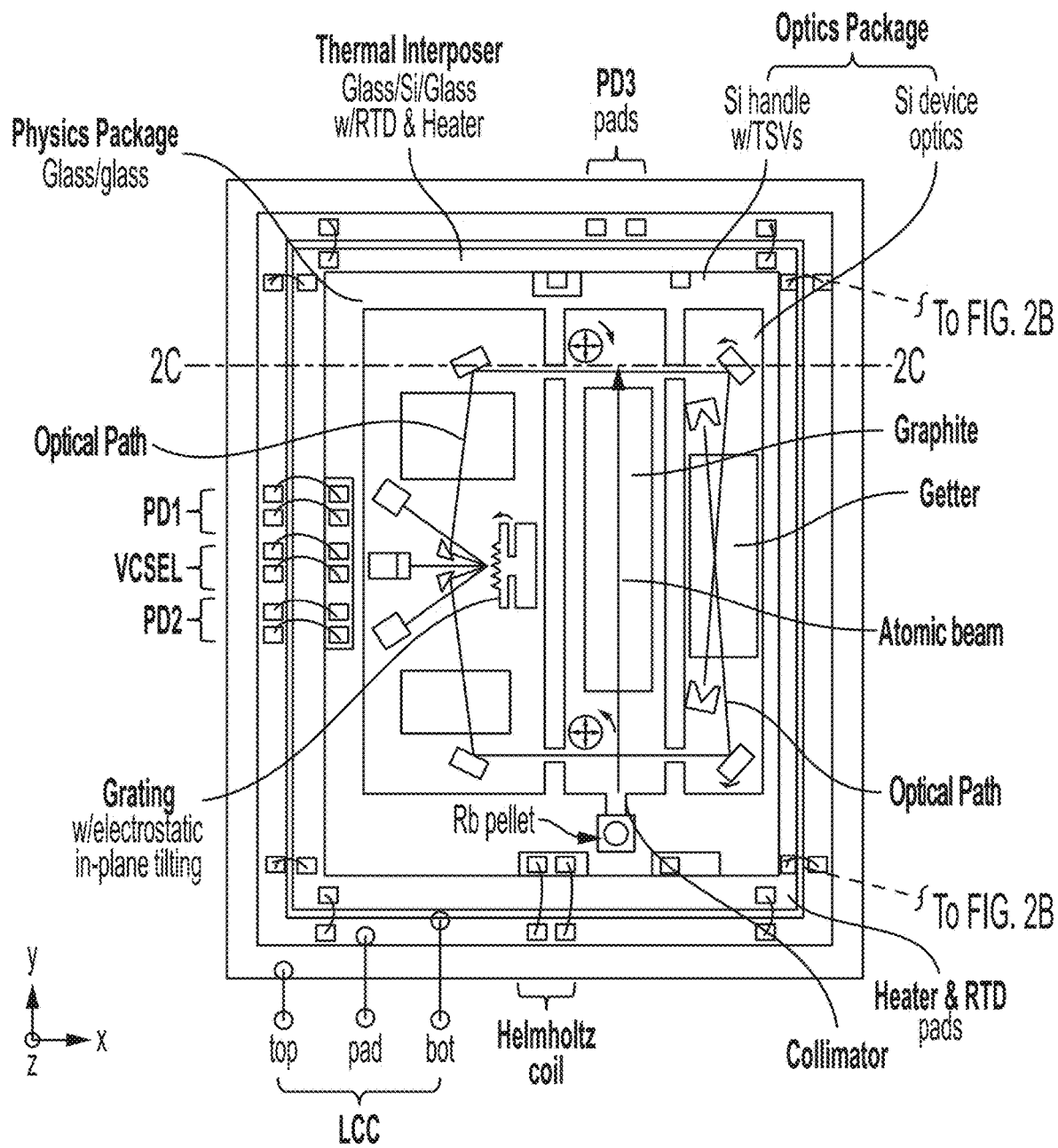
FIG. 2A shows an in-plane cross section at the height of the atomic and optical axis of an exemplary monolithic, chip-scale, atomic beam clock.

An atom source supplies a stream of atoms. The source is preferably positioned near the entrance of a collimator. The atom source may be a pellet as depicted in FIG. 2A, a SAES dispenser (SAES Getters S.p.A., Milan, Italy), a pill dispenser, an alfasource dispenser, a liquid or solid phase of atoms, a light-induced atomic desorption (LIAD) source, a graphite (or other) intercalation compound of atoms, or an electrochemical solid-state source, for example.

This disclosure hereby incorporates by reference herein the following patents for teaching solid-state electrochemical atom sources that may be used in some embodiments, as atom sources and/or atom sinks: U.S. Pat. No. 9,763,314, issued on Sep. 12, 2017; U.S. Pat. No. 9,837,177, issued on Dec. 5, 2017; U.S. Pat. No. 10,056,913, issued on Aug. 21, 2018; U.S. Pat. No. 10,545,461, issued on Jan. 28, 2020; U.S. Pat. No. 10,775,748, issued on Sep. 15, 2020; U.S. Pat. No. 10,828,618, issued on Nov. 10, 2020; and U.S. Pat. No. 11,101,809, issued on Aug. 24, 2021.

The in-plane diffraction grating may be any element understood, by one skilled in the art, to separate a beam of light into two or more beams. In some embodiments of the chip-scale atomic beam clock, the in-plane diffraction grating is lithographically defined within the micro-optical bench.

In some embodiments, the chip-scale atomic beam clock further comprises a first in-plane photodetector configured to detect the first photon beam after being retroflected by the first in-plane mirror, and a second in-plane photodetector configured to detect the second photon beam after being retroflected by the second in-plane mirror. In some embodiments, the first in-plane photodetector is present, while the second in-plane photodetector is not present. In some embodiments, neither the first in-plane photodetector nor the second in-plane photodetector are present.

In some embodiments of the chip-scale atomic beam clock, the microchannels are bonded to a contiguous top layer to form a closed environment under vacuum. The microchannels may be bonded to the contiguous top layer via direct wafer bonding, anodic bonding, metal-metal bonding, or a combination thereof, for example.

The contiguous top layer may be a different composition than the silicon-containing material. In certain embodiments, the contiguous top layer is fabricated from alkali-free glass. In certain embodiments, the contiguous top layer is fabricated from borosilicate glass. Other types of glass may be employed for the contiguous top layer.

The contiguous top layer may be fabricated from a material that has a coefficient of thermal expansion (CTE) less than 0.1 ppm/° C., preferably less than 0.05 ppm/° C., between 25° C. and 300° C. In this specification, CTE refers to the volumetric coefficient of thermal expansion. The value of 0.05 ppm/° C. is equivalent to 5×10$^{-8}$ per degree Celsius. In various embodiments, the CTE of the contiguous top-layer material, calculated as the average from 25° C. to 300° C., is about, or less than about 1, 0.9, 0.8, 0.7, 0.6, 0.5, 0.4, 0.3, 0.2, 0.1, 0.09, 0.08, 0.07, 0.06, 0.05, 0.04, 0.03, 0.02, or 0.01 ppm/° C.

A photodetector may be mounted on the contiguous top layer to collect photoluminescence from an atom-photon interaction region. When the first in-plane photodetector and the second in-plane photodetector are used, the photodetector mounted on the contiguous top layer is a third photodetector. The third photodetector is labeled PD3 in FIGS. 2A, 2B, and 2C, discussed below, in reference to certain embodiments using three photodetectors.

In some embodiments of the chip-scale atomic beam clock, the vertical-cavity surface-emitting laser is configured to emit circularly polarized light. In certain embodiments, the first and second in-plane mirrors are configured to flip the polarization of the first and second photon beam, respectively, between left and right.

In some embodiments of the chip-scale atomic beam clock, the vertical-cavity surface-emitting laser is configured to emit photons with one or more wavelengths selected from about 500 nm to about 2000 nm. In various embodiments, the vertical-cavity surface-emitting laser is configured to emit photons with a wavelength of about, at least about, or at most about 500, 600, 700, 800, 900, 1000, 1100, 1200, 1300, 1400, 1500, 1600, 1700, 1800, 1900, or 2000 mm, including any intervening ranges. Here, intervening ranges, such as 700-1500 nm, means either that a wavelength may be specifically selected with such subrange (700-1500 nm), such as being selected specifically as 789 nm; or, that multiple wavelengths may be used within the subrange, and those wavelengths are not necessarily adjacent. For instance, wavelengths of 700-800 nm and 1200-1300 nm may be selected within the 700-1500 nm subrange.

In some embodiments of the chip-scale atomic beam clock, the chip-scale atomic beam clock comprises an atom-beam tube configured to contain the collimated atomic beam generated by the atom collimator. In certain embodiments, the atom-beam tube is configured to be perpendicular to the first photon beam at a first atom-photon interaction region, and the atom-beam tube is configured to be perpendicular to the second photon beam at a second atom-photon interaction region.

In some embodiments of the chip-scale atomic beam clock, the atom collimator and the vertical-cavity surface-emitting laser are configured so that the collimated atomic beam height and the laser photon beam height are the same or about the same.

The chip-scale atomic beam clock may further comprise an actuator configured to mitigate mis-alignment between the vertical-cavity surface-emitting laser and the micro-optical bench. An actuator is a device that causes motion by converting energy and signals going into the system. The motion produced by the actuator may be rotary or linear, for example. The actuator may be configured to move the vertical-cavity surface-emitting laser so that it better aligns with the micro-optical bench. Alternatively, the actuator may be configured to move the micro-optical bench so that it is better aligned with the vertical-cavity surface-emitting laser. The actuator may be controlled using a computer.

The chip-scale atomic beam clock may further comprise a micro-electromechanical system (MEMS) mechanical actuator configured to mitigate mis-alignment between the vertical-cavity surface emitting laser and the micro-optical bench. This MEMS mechanical actuator may be realized through the addition of strain to cantilevered stages holding mirrors or the laser, for example.

An outer surface of the chip-scale atomic beam clock may be coated with a low-emissivity coating to suppress radiative heat loss. The low-emissivity coating may contain gold, silver, copper, aluminum, or a combination thereof.

In some embodiments of the chip-scale atomic beam clock, a Helmholtz coil is wrapped around both sides of the micro-optical bench. A Helmholtz coil is a device for producing a region of nearly uniform and homogeneous magnetic field. In some embodiments, a Helmholtz coil consists of two identical circular magnetic coils that are placed symmetrically, one on each side of the area along a common axis, and separated by a distance equal to the radius of the coil. Each coil carries an equal electrical current flowing in the same direction. A number of variations exist, including use of rectangular coils, and the numbers of coils may be different than two. Typically, a two-coil Helmholtz pair is used with coils that are circular and in shape and flat on the sides. Electric current is passed through the Helmholtz coil for the purpose of creating a uniform magnetic field, or at least more uniform that would be present without the Helmholtz coil.

Allan variance is a common statistical function used to characterize and classify frequency fluctuations of an atomic clock. See Allan, Statistics of Atomic Frequency Standards, PROCEEDINGS OF THE IEEE Vol. 54, No. 2, 1966, which is incorporated by reference. The Allan deviation ("ADEV") is the square root of the Allan variance. ADEV is used to characterize the random deviations which are related to the noise in the frequency. While there are other ways to define fractional frequency instability including modified Allan deviation, in this disclosure, "fractional frequency instability" is the unitless Allan deviation, ADEV, defined above.

In certain embodiments, and by no means limiting the invention, the chip-scale atomic beam clock is characterized by a short-term Allan deviation (ADEV), in the absence of environmental drift or systematic drift, that is at most $1.8 \times 10^{-10}/\sqrt{\tau}$ where $\tau$ is the integration time in seconds. In such embodiments, at $\tau=1000$ seconds, ADEV is about $6 \times 10^{-12}$, which is lower than commercially available products at 1000 seconds. At a time $\tau=10000$ seconds (about 2.8 hours), ADEV is about $2 \times 10^{-12}$, in such exemplary embodiments.

In some embodiments, the chip-scale atomic beam clock is characterized by a long-term ADEV drift less than $6 \times 10^{13}$ after one week of operation. In various embodiments of the technology, the chip-scale atomic beam clock is characterized by a long-term ADEV drift after one week of operation that is about, or less than about, $10^{-12}$, $9 \times 10^{-13}$, $8 \times 10^{-13}$, $7 \times 10^{-13}$, $6 \times 10^{-13}$, $5 \times 10^{-13}$, $4 \times 10^{-13}$, $3 \times 10^{-13}$, $2 \times 10^{-13}$, or $10^{-13}$, including any intervening ranges.

When the environmental drift or systematic drift is at most $1.8 \times 10^{-10}/\sqrt{\tau}$ ADEV at a one-week (604,800 seconds) integration time is about $2 \times 10^{-13}$. However, after one week, there can be environmental drift or systematic drift, which can cause the ADEV to exceed the calculated ADEV by an order of magnitude or more. In preferred embodiments, the environmental drift or systematic drift causes the ADEV to exceed the calculated ADEV by a factor of 4 or less, a factor of 3 or less, or a factor of 2 or less. For example, when the actual long-term ADEV drift is $6 \times 10^{-13}$ and the calculated ADEV (in the absence of environmental or systematic drift) is $2 \times 10^{-13}$, that equates to a factor of 3.

In some embodiments, the chip-scale atomic beam clock has a volume of about 10 cm$^3$ or less. In various embodiments, the chip-scale atomic beam clock has a volume of about, or at most about, 15, 14, 13, 12, 11, 10, 9, 8, 7, 6, 5, 4, 3, 2, or 1 cm$^3$, including any intervening ranges.

In some embodiments, the chip-scale atomic beam clock has a weight of about 25 grams or less. The weight is the mass on Earth's surface, even if the atomic beam clock is used in outer space. In various embodiments, the chip-scale atomic beam clock has a weight of about, or at most about, 30, 25, 20, 15, 10, 5, 4, 3, or 2 grams, including any intervening ranges.

In some embodiments, the chip-scale atomic beam clock has a power requirement of about 200 mW or less. In various embodiments, the chip-scale atomic beam clock has a power requirement of about, or at most about, 200, 190, 180, 170, 160, 150, 140, 130, 120, 110, 100, 90, 80, 70, 60, 50, 40, 30, 20, or 10 mW, including any intervening ranges.

In various embodiments, the chip-scale atomic beam clock is operable over a temperature range from −40° C. to 85° C. In various embodiments, the chip-scale atomic beam clock is operable at a temperature of about −40° C., −30° C., −20° C., −10° C., 0° C., 10° C., 20° C., 25° C., 30° C., 40° C., 50° C., 60° C., 70° C., 80° C., or 85° C., including any intervening ranges. The chip-scale atomic beam clock may be operated at a single temperature or at multiple temperatures at different times.

In some embodiments, the chip-scale atomic beam clock is operable without Global Positioning System (GPS) calibration. This is a significant feature because GPS signals may become unavailable for a variety of reasons, including interference; atmospheric conditions, such as storms; challenging locations, such as indoors, underground, or in urban areas; GPS satellites being damaged, destroyed, or jammed; or other denial-of-service events.

Variations of the present invention will now be further described, including in reference to the accompanying drawings, FIGS. 1A to 7. The drawings are exemplary and are not intended to limit the scope of the invention as defined by the claims.

FIGS. 1A to 1E provide a conceptual rendering of a chip-scale glass-on-silicon atomic beam clock based on Rb atoms. The atomic beam clock of FIG. 1A includes a laser package, a beam tube, a photodetector (PD), a Rb collimator, and a glass cover. The photodetector is further described in FIGS. 1B and 1C. The Rb collimator is further described in FIG. 1E. The length scales depicted in FIG. 1A are exemplary only.

Figure 1B:
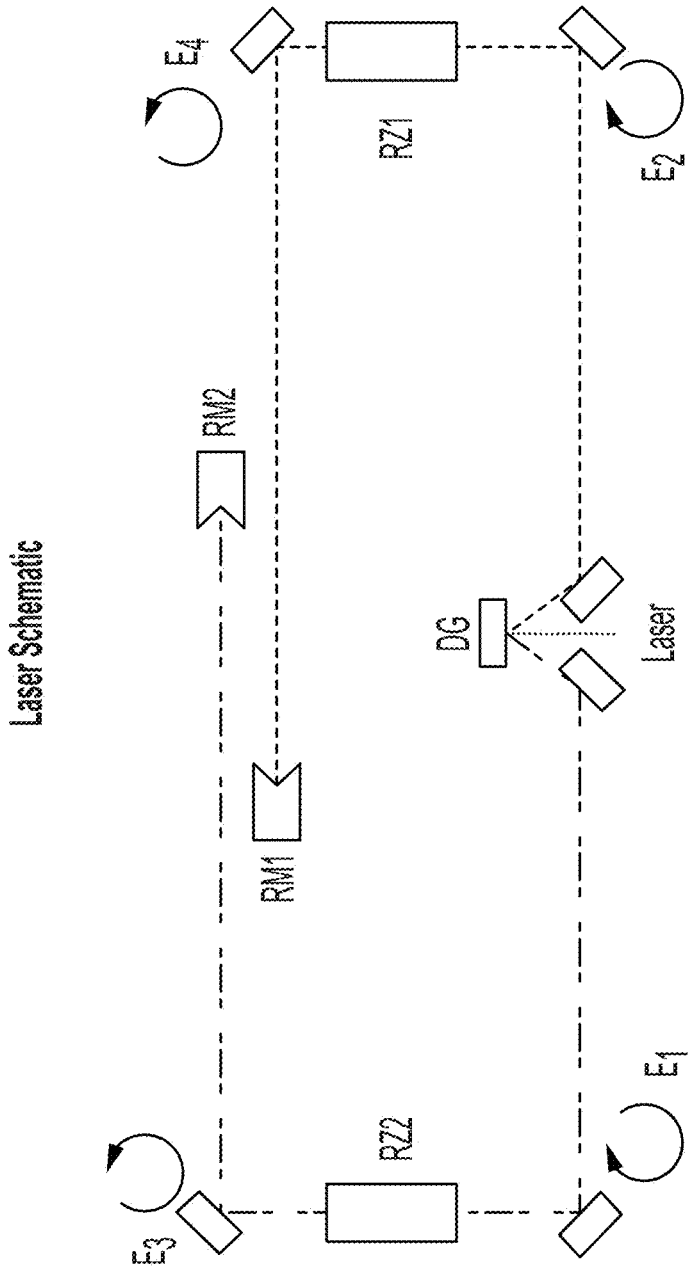
FIG. 1B shows the optical beam path for two optical beams starting at the laser package shown in FIG. 1A, wherein the optical beam paths are configured for in-plane interrogation of the atomic beam.

FIG. 1B shows the optical beam path for two optical beams starting at the laser package. The optical beam paths are configured for in-plane interrogation of the atomic beam. Circularly polarized laser light is split into two beams by a diffraction grating (DG). After the interaction with the Rb atoms in Ramsey zones RZ1 and RZ2, each beam propagates a distance 2.4 cm (corresponding to a microwave phase shift of 7) before being retroflected by an in-plane roof mirror (RM1 and RM2) that flips the polarization between left to right.

Figure 1C:
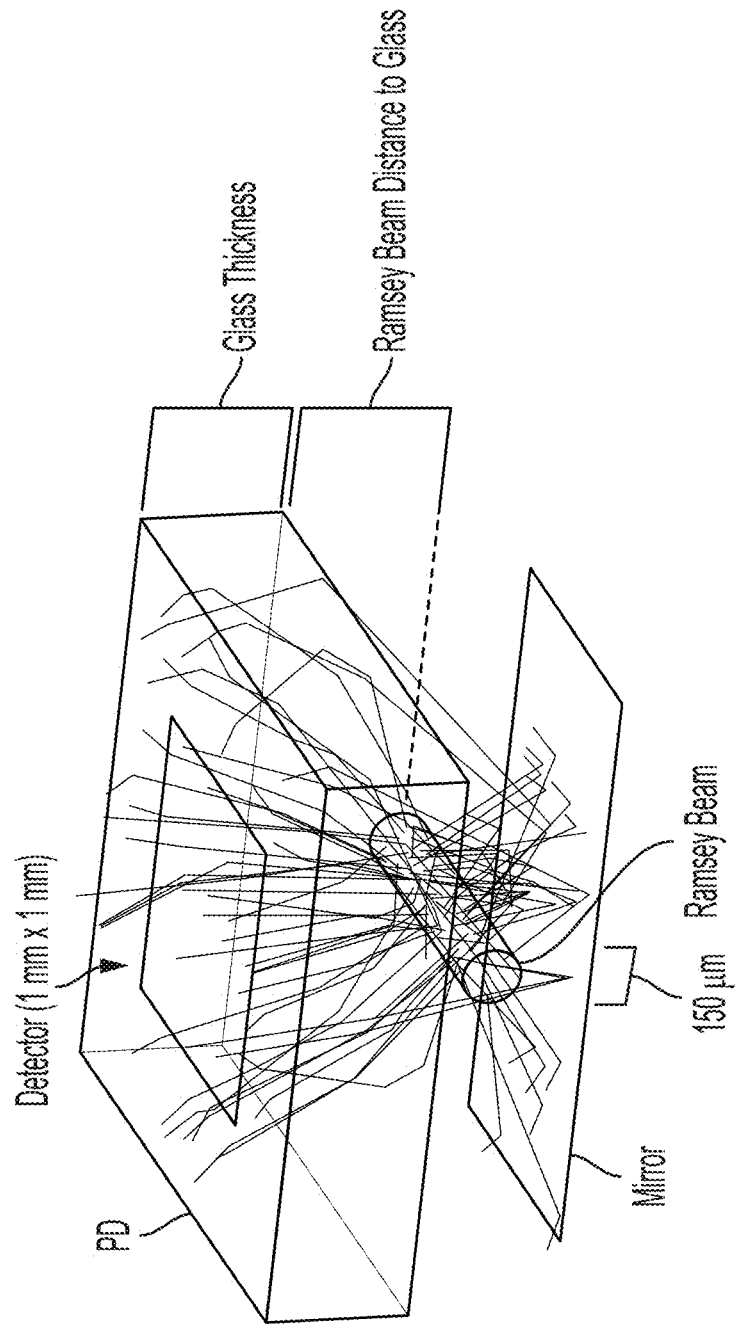
FIG. 1C shows a simulation geometry of optical detection efficiency of the photodetector shown in FIG. 1A, assuming a 1 mm×1 mm photodetector, a mirror underneath, and a thin glass membrane separating the multi-pixel photon counter from the second Ramsey zone.

FIG. 1C shows a Zemax OpticStudio® (Zemax LLC, Kirkland, Washington, U.S.) simulation geometry of optical detection efficiency assuming a 1 mm×1 mm photodetector, a mirror underneath, and a thin glass membrane separating the multi-pixel photon counter (the PD) from the second Ramsey zone RZ2.

Figure 1D:
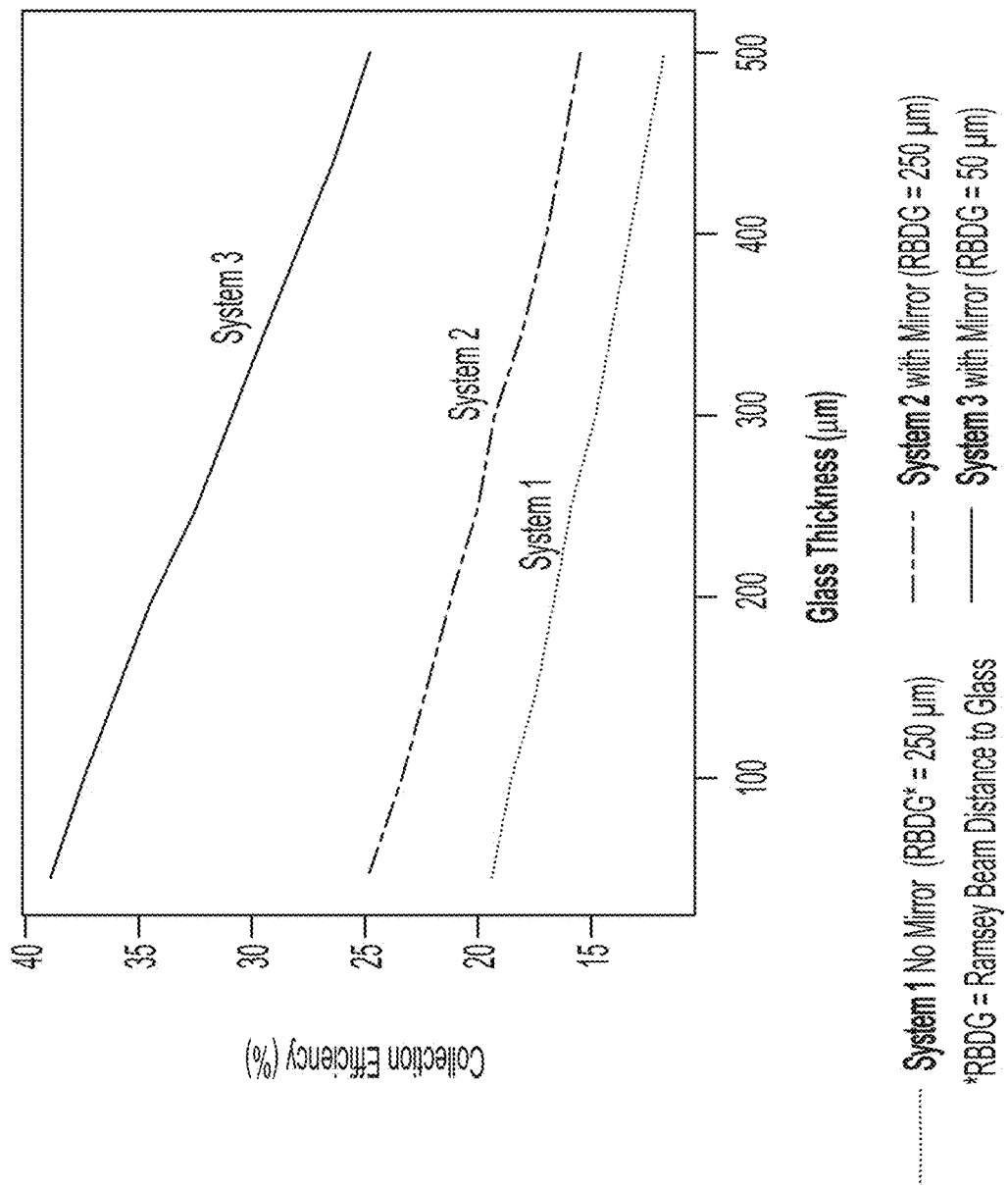
FIG. 1D shows calculated detection efficiency with various configurations of the photodetector in FIG. 1A and with simulation geometry according to FIG. 1C.

FIG. 1D shows calculated detection efficiency with various configurations, labeled as Systems 1, 2, and 3, and in reference to FIG. 1C. The y-axis is collection efficiency in percentage, and the x-axis is glass thickness in microns. In System 1, there is no mirror, and the Ramsey beam distance to glass is 250 μm. In System 2, the mirror is present, and the Ramsey beam distance to glass is 250 μm. In System 3, the mirror is present, and the Ramsey beam distance to glass is 50 μm. The collection efficiency increases from System 1 to System 2, and from System 2 to System 3. Also, higher glass thickness decreases the collection efficiency in all cases. As one example, in System 3 with a Ramsey beam distance to glass is 50 μm and a glass thickness of 150 mm, the simulated collection efficiency is about 37%.

Figure 1E:
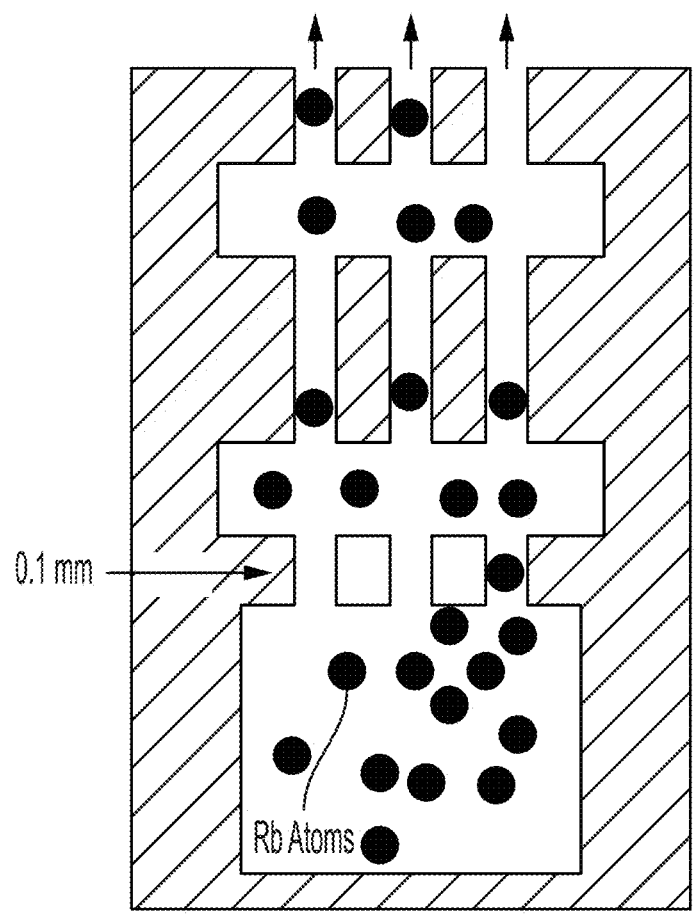
FIG. 1E shows a top-down schematic diagram of an exemplary Rb collimator that provides differential pumping and creation of a collimated beam of rubidium atoms.

FIG. 1E shows a top-down schematic diagram of an exemplary Rb collimator that provides differential pumping and creation of a beam of rubidium atoms. The length scale depicted in FIG. 1E (0.1 mm) is exemplary only.

Figure 2B:
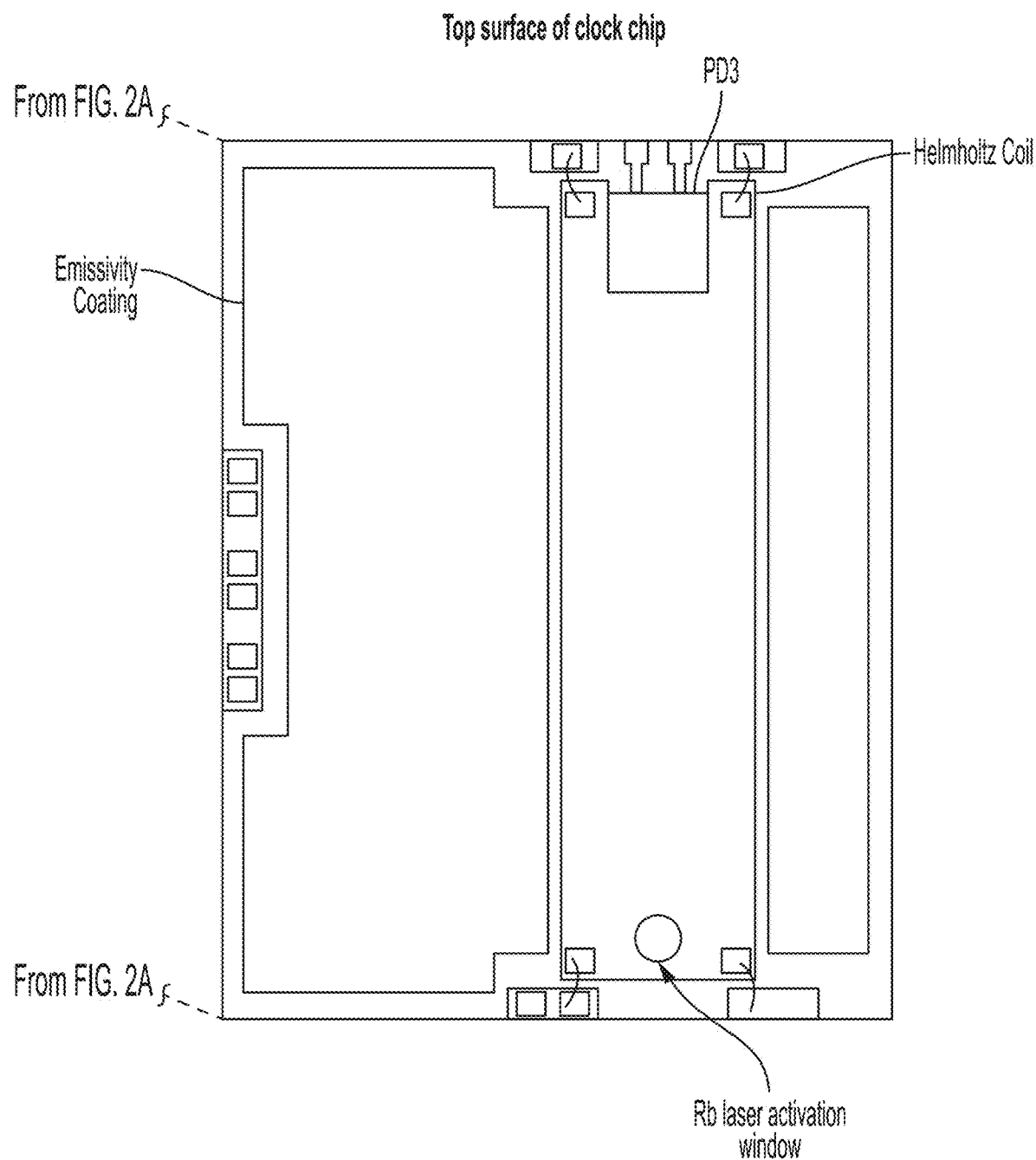
FIG. 2B shows the top surface of the exemplary monolithic, chip-scale, atomic beam clock that is shown in FIG. 2A.
Figure 2C:
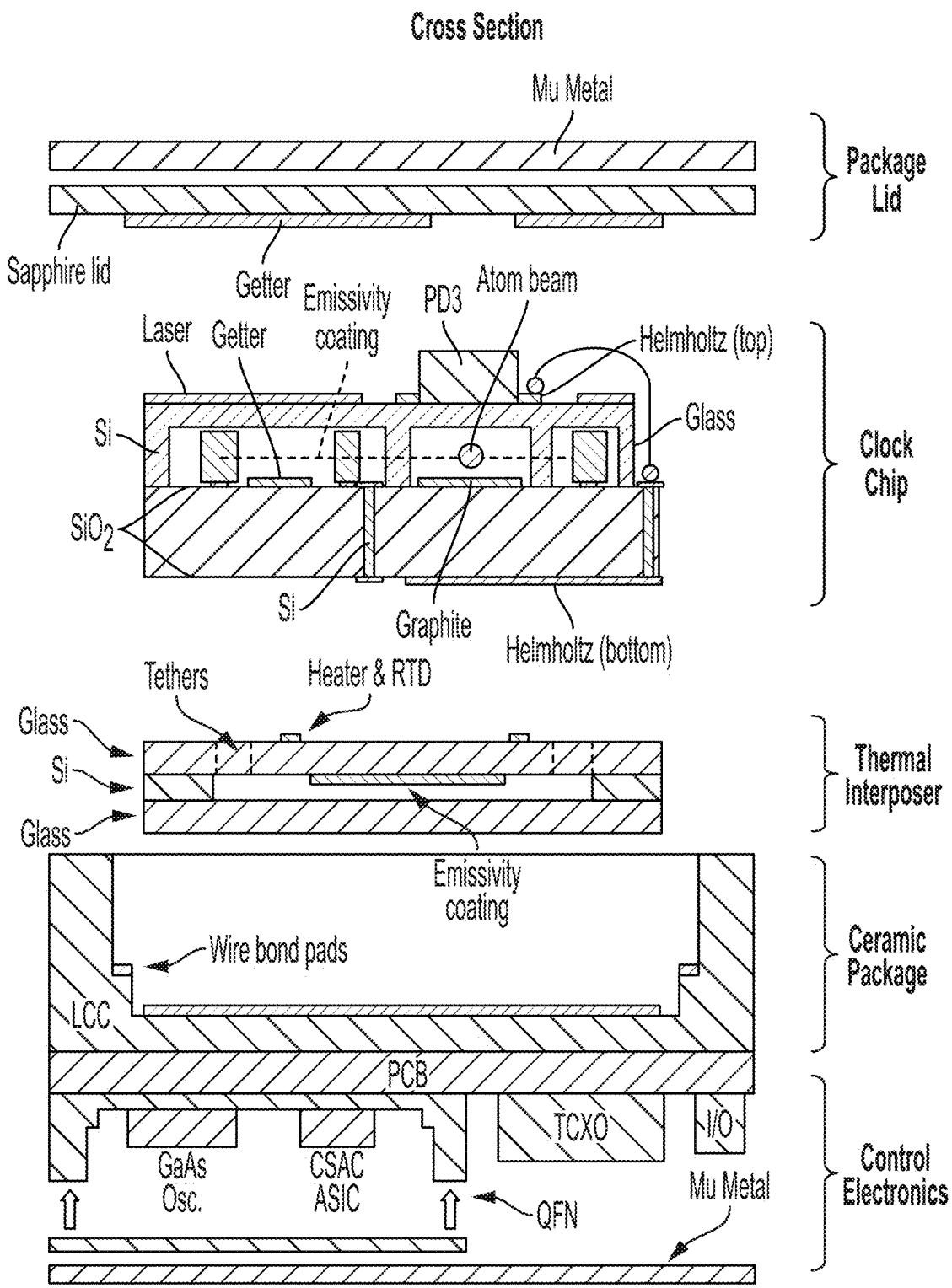
FIG. 2C shows a cross section of the exemplary monolithic, chip-scale, atomic beam clock that is shown in FIG. 2A, corresponding to the dashed line labeled 2C-2C in FIG. 2A.

A detailed master diagram of an exemplary monolithic, chip-scale, atomic beam clock is shown in FIGS. 2A, 2B, and 2C. An in-plane cross section (x-y) at the height of the atomic and optical axis is shown in FIG. 2A. The atomic beam path is established using a Rb source pellet in a chamber, a collimator, and an atom-beam tube. The atom-beam tube may be 1.5 mm×15 mm, for example. The source chamber, collimator, and tube are machined into the inner surfaces of a sandwiched two-wafer glass stack comprising non-alkali glass engineered to match the thermal expansion coefficient of Si to within ACTE <0.05 ppm/° C. up to 300° C. The underside of the atom cavity is defined by a Si handle wafer with through-wafer vias (TSVs) and metal redistribution layers (RDLs). The top side is a contiguous 150 μm glass membrane allowing for optimal out-of-plane (z) photoluminescence collection. The glass-glass-Si stack forms a monolithically integrated atomic-optics package, which may be referred to herein as a "clock chip" or "CC". In FIG. 1A, PD refers to photodetector, TSV refers to through-wafer via, RTD refers to resistance temperature detector, and LCC refers to leadless chip carrier.

The excitation optical path in FIG. 2A is defined by a vertical-cavity surface-emitting laser (VCSEL) mounted on its side with associated collimation lens and with polarization plate, passive and steerable micro-machined Au-coated Si optics, and two in-plane photodetectors, PD1 and PD2. The VCSEL is mounted directly to the same Si handle wafer which defines the bottom of the atom tube. The VCSEL beam height is designed to be the same as the atom beam height. The Si optics are micro-machined in a 200 μm Si device layer separated from the Si handle layer by 3 μm of $SiO_2$. The optical axis height is also centered at the same height as the atom beam.

In FIG. 2A, the collimated and rotated laser beam impinges on a beam-steering Si grating which acts as a beam splitter. The m=1 reflections are directed by a set of mirrors to intersect the atom beam in two locations 15 mm apart. An optical beam length of 2.5 cm for each opposing beam path is achieved by folding the beams back onto themselves using steerable MEMS mirrors and polarization-rotating mirrors. The m=2 reflections are directed to a pair of matched photodetectors to be used for laser and beam path stabilization. Both lasers and photodetectors are die-attached to the Si handle wafer with through-wafer vias.

An important role of the through-wafer vias and metal redistribution layers is to bring electrical connectivity from the area under wafer-level package vacuum to the edge of the Si handle wafer which is exposed to the chip-carrier vacuum.

The top surface of the clock chip is shown in FIG. 2B. The majority of the surface is covered with a thin emissivity coating (e.g., Au coating) to suppress radiative heat loss. A circular opening (d<500 μm) in the emissivity layer is maintained to allow for laser priming of the Rb source pellet. In line with the atom beam tube, the top half of a Helmholtz coil is defined by a separate strip of Au. The bottom of the Helmholtz loop runs in parallel, on the bottom-side metal redistribution layer of the Si handle wafer.

FIG. 2C shows a cross section (x-z) of FIG. 2A, corresponding to the dashed line labeled 2C-2C in FIG. 2A. In FIG. 2C, the top and bottom halves of the Helmholtz loop are connected first by wire bonds from the top surface of the clock chip to a metal redistribution layer on the handle surface, followed by a through-wafer vias to the bottom-side metal redistribution layer. A third photodetector (PD3) is mounted on the top surface of the clock chip to collect photoluminescence from the atom-laser interaction region.

Multiple getters are shown in FIG. 2C. Vacuum and Rb background pressure may be maintained within the wafer-level packaged (WLP) clock chip using either or both evaporable getters (EG) and non-evaporable getters (NEGs). The bottom of the atom chamber may be lined with an NEG by metal-metal bonding an elongated, thin, graphite block. One or more EGs may be deposited on all unused Si handle layer surfaces.

The clock chip may be ovenized such as at 90° C. with <100 milliKelvin (mK) thermal stability, using a thermal interposer. The clock chip-thermal interposer assembly may be die-attached and wire-bonded inside a leadless ceramic package. Some embodiments utilize a glass-Si-glass triple stack interposer with thermally resistive tethers, a Pt heater, a RTD, and a bottom-side emissivity coating.

The clock chip may be vacuum-sealed, such as to <1 mTorr, and surface-mounted on a printed circuit board (PCB). The preferred vacuum pressure to reduce background collisions is $10^{-3}$ torr or lower, such as $10^{-4}$, $10^{-5}$, $10^{-6}$, $10^{-7}$, or $10^{-8}$ torr, or even lower. A quad flat no-lead (QFN) package containing the GHz oscillator and chip-scale atomic-clock application-specific integrated circuit (CSAC ASIC) for clock control, a temperature-compensated crystal oscillator (TCXO), and an input/output (I/O) connector may be surface-mounted to the back of the PCB. The complete assembly may be mounted in a thin mu-metal box, as depicted in FIG. 2C. Mu metal is a nickel-iron soft ferromagnetic alloy.

Figure 3:
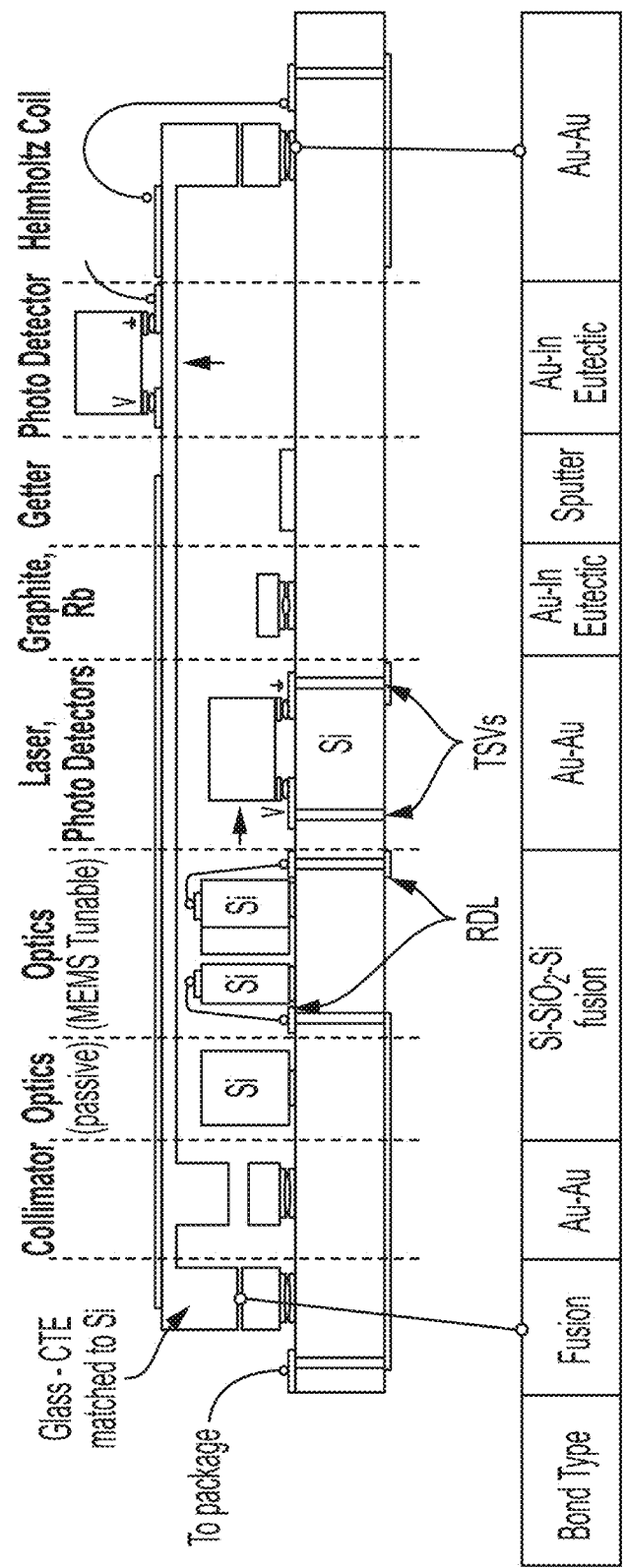
FIG. 3 shows a schematic diagram of the bonding techniques used to assemble the wafer-level packaged clock chip, in various embodiments

FIG. 3 shows a schematic diagram of the bonding techniques used to assemble the wafer-level packaged clock chip, in various embodiments. Due to the overall clock-chip dimensional stability requirements, every die-attach and wafer-bond surface is preferably tailored for stability and manufacturability. Fusion bonding may be used for the glass/glass sandwich physics package. Anodic bonding may be used to seal the physics package with a CTE-matched Si handle wafer. Alternatively, and preferably, Au—Au compression bonding may be employed, to minimize creep as well as to mitigate possible roughness introduced by glass machining. Au—Au bonding may be employed for the critical VCSEL and in-plane PDs. Since the position stability of the Rb source, NEG, and PD on the clock-chip top is less critical, a more forgiving Au—In eutectic bonding may be used, for example.

Figure 4:
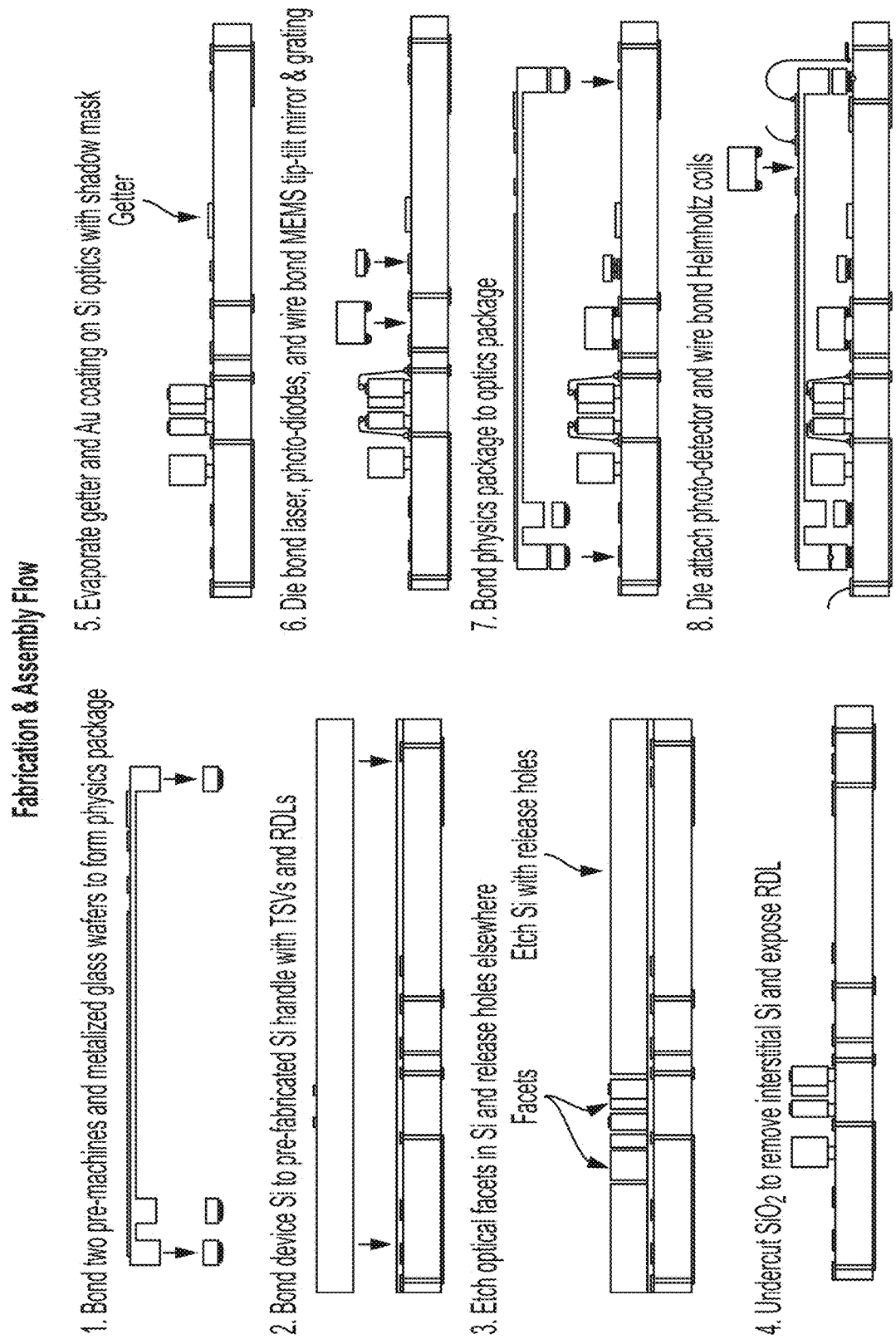
FIG. 4 is an exemplary diagram depicting the assembly and fabrication process for making a wafer-scale clock chip, in various embodiments

FIG. 4 is an exemplary diagram depicting the assembly and fabrication process for making a wafer-scale clock chip, in various embodiments. The process begins by predefining metal layers on the two halves of the glass sandwich, machining the inner surfaces, and fusion bonding the wafers together (step 1). Separately, a silicon-on-insulator stack is formed with a device layer (e.g., a 200-μm layer) and a pre-fabricated handle with TSVs and RDLs (step 2). Si optical elements are etched into the device layer and release holes are etched into the surrounding area (step 3). Those release holes allow for releasing the Si surrounding the optical elements by removing the oxide layer using wet etching (step 4). The sides of the Si optical elements are then metalized, to increase reflectivity, using a shadow mask to avoid TSV and bond surfaces (step 5). Similarly, an evaporable getter is evaporated on the Si handle wafer surface, in step 5. Next, the MEMS mirrors are wire-bonded to TSVs; and the VCSEL assembly, photodiodes, and graphite NEG are die-bonded to the RDL on the handle wafer (step 6). The clock chip is completed by wafer-level bonding the glass atom tube structure to the Si handle wafer using Au—Au bonding (step 7). Finally, the photo-diode is attached to the top of the clock chip, and the Helmholtz coils are wire-bonded (step 8). All references in this paragraph to specific dimensions and materials are for purposes of illustrating this drawing only, and should be understood in the context of the entire specification.

It will be recognized by a skilled artisan that various modifications may be made without departing from the principles of the invention. Modular integration of the micro-optical bench and atomic vapor cell may be optimized to improve SNR and reduce the drift rates. The silicon micro-optical bench may be further optimized to reduce overall volumes. Further optimization opportunities involve the integration of a mirror at the readout Ramsey zone, an improved vacuum environment, materials optimization, through-silicon vias, beam-tube integration, and decreasing the thermal and power load using improved packaging and custom microwave and digital electronics.

This invention is applicable to portable atomic instruments, magnetometers, gravimeters, accelerometers, sensors, and lasers, for example. Electronic-warfare systems may utilize the disclosed chip-scale atomic beam clock, such as to enable high-speed analog-digital converters that operate at higher frequency and with more bits. Similarly, radar systems incorporating the disclosed chip-scale atomic beam clock may benefit from lower local oscillator noise, enabling the detection of slow-moving objects and for synthetic aperture radar (SAR) at higher or geosynchronous orbit.

On a satellite, submarine, or other vehicle, a stable atomic beam clock allows long-time secure communication over days or weeks, even in a GPS-denied environment. This long-time secure communication contrasts with the existing state of art, which only provides minutes of secure communication at best.

For space-based radar, the disclosed chip-scale atomic beam clock may enable the identification of slow-moving targets, and the removal of "clutter" from radar return signals.

EXAMPLE

Figure 5:
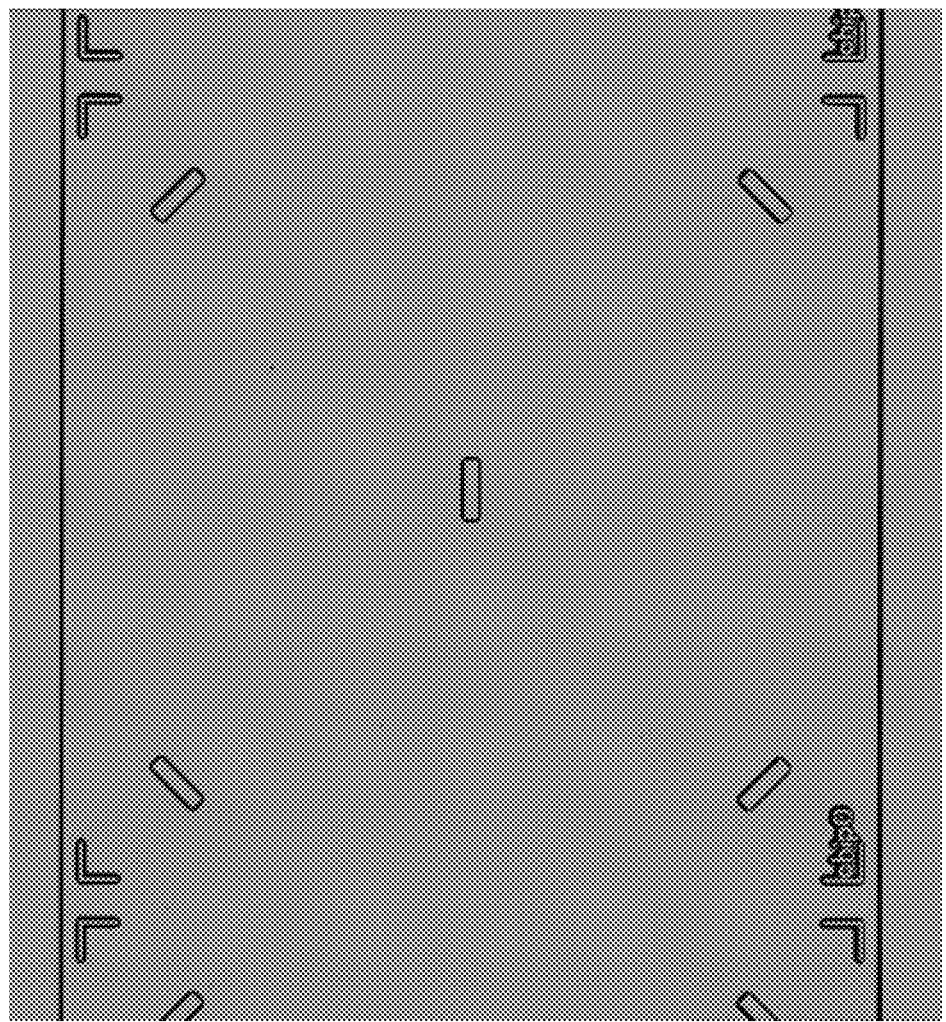
FIG. 5 is a photomicrograph of a silicon micro-optical bench, in the Example.
Figure 6:
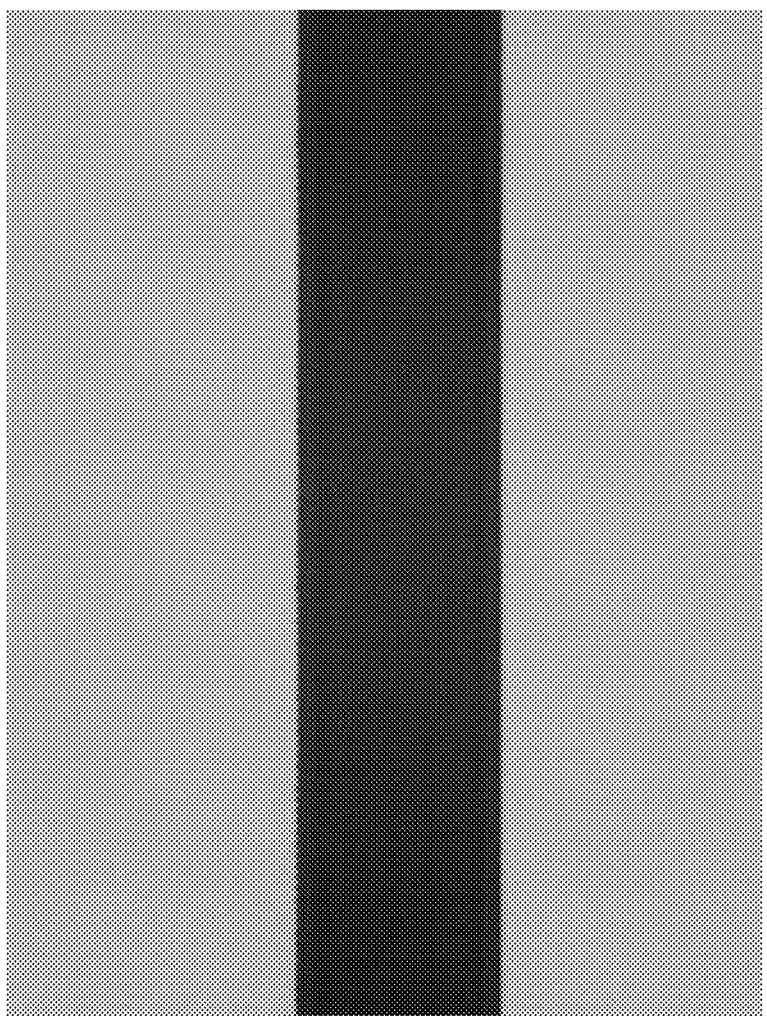
FIG. 6 is a photomicrograph of a lithographically defined grating, in the Example.
Figure 7:
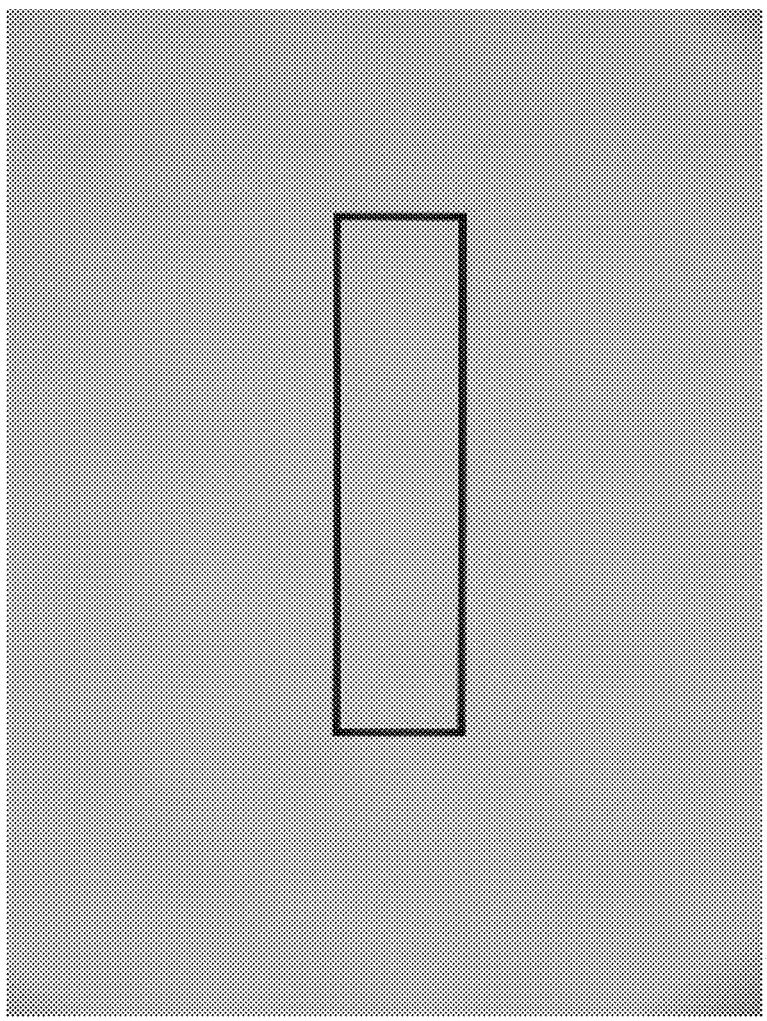
FIG. 7 is a photomicrograph of a lithographically defined mirror, in the Example.

Data from a test bench configured for an atomic clock is shown in FIGS. 5, 6, and 7. A micro-optical bench is made with in-plane micro-fabricated mirrors. The mirrors are made of silicon (Si). FIG. 5 is a photomicrograph of the micro-optical bench. FIG. 6 is a photomicrograph of a lithographically defined grating in the micro-optical bench. FIG. 7 is a photomicrograph of a lithographically defined mirror in the micro-optical bench.

In this realization a silicon reflection grating (center of FIG. 6) reflects and splits a single beam of light into two directions ($m=\pm 1$) based on the periodicity of the diffraction grating. This light is collected by two silicon mirrors (bottom left and bottom right of FIG. 7) and routed around the chip in clockwise and anti-clockwise directions. The silicon micro-optical bench in the Example is capable of realizing two counter-propagating beams of light.

All publications, patents, and patent applications cited in this specification are herein incorporated by reference in their entirety as if each publication, patent, or patent application were specifically and individually put forth herein.

In this detailed description, reference has been made to multiple embodiments and to the accompanying drawings in which are shown by way of illustration specific exemplary embodiments of the invention. These embodiments are described in sufficient detail to enable those skilled in the art to practice the invention, and it is to be understood that modifications to the various disclosed embodiments may be made by a skilled artisan.

Where methods and steps described above indicate certain events occurring in certain order, those of ordinary skill in the art will recognize that the ordering of certain steps may be modified and that such modifications are in accordance with the variations of the invention. Additionally, certain steps may be performed concurrently in a parallel process when possible, as well as performed sequentially.

The embodiments, variations, and figures described above should provide an indication of the utility and versatility of the present invention. Other embodiments that do not provide all of the features and advantages set forth herein may also be utilized, without departing from the spirit and scope of the present invention. Such modifications and variations are considered to be within the scope of the invention defined by the claims.

What is claimed is:

1. A chip-scale atomic beam clock comprising:
   (a) a micro-optical bench that is fabricated from a silicon-containing material;
   (b) an atom collimator configured to generate a collimated atomic beam via differential pumping through microchannels within said micro-optical bench;
   (c) a vertical-cavity surface-emitting laser configured to emit laser photons horizontally in the plane of said micro-optical bench;
   (d) an in-plane diffraction grating configured to split said laser photons into a first photon beam and a second photon beam; and
   (e) a first in-plane mirror configured to retroflect said first photon beam, and a second in-plane mirror configured to retroflect said second photon beam, wherein said first and second in-plane mirrors are lithographically defined within said micro-optical bench,
   wherein said first photon beam and said second photon beam interrogate said collimated atomic beam in-plane with said micro-optical bench.

2. The chip-scale atomic beam clock of claim 1, wherein said silicon-containing material is silicon, silica, fused silica, silicates, aluminosilicates, borosilicates, silicon nitrides, silicon oxynitrides, silicon carbides, silicon oxycarbides, or combinations thereof.

3. The chip-scale atomic beam clock of claim 1, wherein said collimated atomic beam contains Rb atoms, Cs atoms, Yb atoms, Hg atoms, Sr atoms, Al atoms, Ca atoms, H atoms, or a combination thereof.

4. The chip-scale atomic beam clock of claim 1, wherein said in-plane diffraction grating is lithographically defined within said micro-optical bench.

5. The chip-scale atomic beam clock of claim 1, wherein said chip-scale atomic beam clock further comprises a first in-plane photodetector configured to detect said first photon beam after being retroflected by said first in-plane mirror, and a second in-plane photodetector configured to detect said second photon beam after being retroflected by said second in-plane mirror.

6. The chip-scale atomic beam clock of claim 1, wherein said microchannels are bonded to a contiguous top layer to form a closed environment under vacuum.

7. The chip-scale atomic beam clock of claim 6, wherein said microchannels are bonded to said contiguous top layer via direct wafer bonding, anodic bonding, metal-metal bonding, or a combination thereof.

8. The chip-scale atomic beam clock of claim 6, wherein said contiguous top layer is a different composition than said silicon-containing material.

9. The chip-scale atomic beam clock of claim 6, wherein said contiguous top layer is fabricated from a material that has a coefficient of thermal expansion less than 0.05 ppm/° C. between 25° C. and 300° C.

10. The chip-scale atomic beam clock of claim 6, wherein said contiguous top layer is fabricated from alkali-free glass.

11. The chip-scale atomic beam clock of claim 6, wherein said contiguous top layer is fabricated from borosilicate glass.

12. The chip-scale atomic beam clock of claim 6, wherein a photodetector is mounted on said contiguous top layer to collect photoluminescence from an atom-photon interaction region.

13. The chip-scale atomic beam clock of claim 1, wherein said vertical-cavity surface-emitting laser is configured to emit circularly polarized light.

14. The chip-scale atomic beam clock of claim 13, wherein said first in-plane mirror is configured to flip the polarization of said first photon beam between left and right, and wherein said second in-plane mirror is configured to flip the polarization of said second photon beam between left and right.

15. The chip-scale atomic beam clock of claim 1, wherein said vertical-cavity surface-emitting laser is configured to emit photons with one or more wavelengths selected from about 500 nm to about 2000 nm.

16. The chip-scale atomic beam clock of claim 1, wherein said chip-scale atomic beam clock comprises an atom-beam tube configured to contain said collimated atomic beam generated by said atom collimator.

17. The chip-scale atomic beam clock of claim 16, wherein said atom-beam tube is configured to be perpendicular to said first photon beam at a first atom-photon interaction region, and wherein said atom-beam tube is configured to be perpendicular to said second photon beam at a second atom-photon interaction region.

18. The chip-scale atomic beam clock of claim 1, wherein said atom collimator and said vertical-cavity surface-emitting laser are configured so that collimated atomic beam height and laser photon beam height are the same or about the same.

19. The chip-scale atomic beam clock of claim 1, wherein said chip-scale atomic beam clock further comprises an actuator configured to mitigate mis-alignment between said vertical-cavity surface-emitting laser and said micro-optical bench.

20. The chip-scale atomic beam clock of claim 1, wherein an outer surface of said chip-scale atomic beam clock is coated with a low-emissivity coating to suppress radiative heat loss.

21. The chip-scale atomic beam clock of claim 20, wherein said low-emissivity coating contains gold, silver, copper, aluminum, or a combination thereof.

22. The chip-scale atomic beam clock of claim 1, wherein a Helmholtz coil is wrapped around both sides of said micro-optical bench.

23. The chip-scale atomic beam clock of claim 1, wherein said chip-scale atomic beam clock is characterized by a long-term ADEV drift less than $6 \times 10^{-13}$ after one week of operation.

24. The chip-scale atomic beam clock of claim 1, wherein said chip-scale atomic beam clock has a volume of about 10 $cm^3$ or less.

25. The chip-scale atomic beam clock of claim 1, wherein said chip-scale atomic beam clock has a weight of about 25 grams or less.

26. The chip-scale atomic beam clock of claim 1, wherein said chip-scale atomic beam clock has a power requirement of about 200 mW or less.

27. The chip-scale atomic beam clock of claim 1, wherein said chip-scale atomic beam clock is operable over a temperature range from −40° C. to 85° C.

28. The chip-scale atomic beam clock of claim 1, wherein said chip-scale atomic beam clock is operable without Global Positioning System calibration.

* * * * *